United States Patent [19]

Roberts et al.

[11] Patent Number: 4,922,212

[45] Date of Patent: May 1, 1990

[54] OSCILLATOR TEMPERATURE COMPENSATING CIRCUIT USING STORED AND CALCULATED VALUES

[75] Inventors: Glyn Roberts; Gordon Paynter, both of Calgary; Remesh B. Krishnasastry, Ottawa, all of Canada

[73] Assignee: NovAtel Communications, Ltd., Calgary, Canada

[21] Appl. No.: 361,551

[22] Filed: Jun. 5, 1989

[51] Int. Cl.⁵ ............................................. H03L 1/02
[52] U.S. Cl. .................................... 331/176; 331/158
[58] Field of Search ..................... 331/176, 66, 116 R, 331/158

[56] References Cited

U.S. PATENT DOCUMENTS

| | | |
|---|---|---|
| 3,713,033 | 1/1973 | Frerking .......................... 331/116 R |
| 3,719,838 | 3/1973 | Peduto et al. .............. 331/116 R X |
| 3,821,665 | 6/1974 | Irwin et al. ...................... 331/116 R |
| 4,160,183 | 7/1979 | Kusters et al. ............. 331/116 R X |
| 4,560,959 | 12/1985 | Rokos et al. ................ 331/116 R X |
| 4,611,181 | 9/1986 | Fukumura et al. .................... 331/66 |
| 4,633,422 | 12/1986 | Brauer ............................. 331/176 X |
| 4,746,879 | 5/1988 | Ma et al. ........................... 331/176 X |

OTHER PUBLICATIONS

T. Miyayama et al., "A New Digitally Temperature Compensated Crystal Oscillator for a Mobile Telephone System", pp. 327–333, 42nd Annual Frequency Control Symposium—1988, CH2588-2/88/0000—327 IEEE.

Primary Examiner—Siegfried H. Grimm
Attorney, Agent, or Firm—Nutter, McClennen & Fish

[57] ABSTRACT

A voltage-controlled oscillator includes a compensating signal value calculator which calculates the value of a function representing the portion of the oscillator temperature-frequency transfer curve corresponding to the ambient temperature. A signal corresponding to the calculated value is then applied to the voltage-controlled oscillator as the control voltage. Basically, an oscillator temperature-frequency transfer curve is partitioned into n segments. For each segment an offset value, $x_n$, equal to the difference between the frequency at the start of the segment and the desired frequency, is stored in a look-up table. When a compensating signal value is required, the compensating signal value calculator retrieves from the look-up table the $x_n$ values corresponding to the segment immediately preceding and succeeding segment k, segments "k−1" and "k+1". The retrieved values are labeled $x_k$, $x_{k-1}$, and $x_{k+1}$, respectively. It then calculates a function representing the portion of the transfer curve passing through three points corresponding to the values:

$$x(T) = x_k + \left(\frac{x_{k+1} - x_{k-1}}{2}\right)(\text{delta } T) + \left(\frac{x_{k+1} - 2x_k + x_{k-1}}{2}\right)(\text{delta } T)^2 \quad (2)$$

The compensating signal value is then calculated by substituting the actual delta T value into the equation. If the oscillator output frequency has shifted due to aging of the crystal, an aging offset value, $x_A$, is added to the equation, and the compensating signal compensates for frequency variations related to both temperature and aging.

13 Claims, 4 Drawing Sheets

FIG. 4

OSCILLATOR TEMPERATURE COMPENSATING CIRCUIT USING STORED AND CALCULATED VALUES

FIELD OF THE INVENTION

The invention relates generally to voltage-controlled oscillators and more particularly to controlling the operation of the oscillators in environments with varying temperatures.

BACKGROUND OF THE INVENTION

Voltage-controlled crystal oscillators are typically very accurate. Thus they are used in electronic circuits to produce, for example, precise clock signals. The frequency of the output signal of a crystal oscillator varies with changes in ambient temperature, however, and these changes affect the operation of the circuitry in which it is used. Thus it is desirable to control either the ambient temperature of the oscillator or the temperature-related variations in the oscillator frequency.

The ambient temperature of the oscillator may be controlled by enclosing it in an oven. One of the problems with using an oven is the relatively large amount of power required to operate it. It is therefore impractical to use ovens in circuits which are battery powered, such as cellular handheld telephone circuitry powered by an internal battery.

If controlling the ambient temperature of the oscillator is impractical, the frequency of the oscillator output signal may be maintained by compensating it, that is, altering the voltage which controls the oscillator to offset the temperature-driven frequency variations. The compensating voltage, or signal, must alter the oscillator output to precisely offset the change in the output signal due to temperature. Otherwise, the compensated oscillator output signal frequency is not accurate.

Temperature-driven frequency variations are not linearly related to changes in temperature. Thus accurate compensation is difficult. One compensation method employs a look-up table that contains compensating signal values corresponding to various temperatures. As the oscillator signal frequency varies due to changes in ambient temperature, compensation is accomplished by retrieving from the look-up table the compensating signal value associated with the temperature and applying a signal corresponding to the stored value to the oscillator as the voltage control signal.

The look-up table is generated by operating the oscillator at various temperatures and determining the control signal values which will return the oscillator output signal to the desired frequency. The size of the look-up table determines the accuracy of the compensation. A relatively large look-up table is required if the oscillator is operated over a wide temperature range and/or the tolerance for frequency variation is tight. Regardless of how large the look-up table is, errors are introduced when the ambient temperature is not precisely at a temperature for which a compensation value is stored.

Presumably, the stored value for the temperature closest to the ambient temperature is used as the compensating signal value. However, due to the non-linear relationship between temperature and frequency the error associated with using this compensating signal value may be relatively large for certain temperatures. Thus it is desirable to determine the compensating signal value corresponding to all temperatures within the operating range while at the same time using a look-up table which is of a manageable size.

An alternative to retrieving the compensating signal values from a look-up table is to generate them using a logical function generator. Ideally, the function generator is programmed with a function which mathematically represents the relationship between temperature and frequency, that is, the temperature-frequency transfer curve. The compensating signal values are calculated for various temperatures by applying to the logical function generator a signal, such as a thermistor signal, that varies monotonically with temperature. The generator then generates an associated compensating signal value by substituting the temperature signal value into the generator function.

In order to program the function generator, a function representing the entire temperature-frequency transfer curve must be found. If the transfer curve is irregular, which is the case for most crystal oscillators, a simple function will not suffice to describe it precisely. Thus the compensating signal values calculated by the function generator for certain portions of the transfer curve, that is, for certain temperatures within the temperature range, may not be accurate.

Crystal oscillators are also subject to variations in frequency due to the aging of the crystal. As the crystal ages the entire temperature-frequency transfer curve shifts up or down. Typically, to compensate for the effects of aging, a variable resistor is included in the circuit. The variable resistor is manually adjusted to alter the output signal frequency such that the shift is offset. Using this method of compensation, the oscillator circuitry must be physically accessible. In addition, the variable resistor must be a discrete component rather than part of an integrated circuit. These constraints add complexity to the circuit design and increase the cost of manufacture over that of a circuit which is fully integrated. Thus it is desirable to compensate for the aging of the crystal using integrated circuit technology.

SUMMARY OF THE INVENTION

A voltage-controlled oscillator includes a compensating signal value calculator which formulates a function representing the portion of the oscillator temperature-frequency transfer curve corresponding to the ambient temperature. The compensating signal value is then calculated using this function.

Generally, a second-order Taylor Series function describes the frequency-temperature transfer curve. However, due to the non-linear relationship between temperature and frequency, the coefficients of the Taylor Series vary along the curve. Thus the coefficients for the portion of the curve corresponding to the ambient temperature are first calculated and the compensating signal value is formulated using the appropriate Taylor Series function.

In brief summary, an oscillator temperature-frequency transfer curve is partitioned into n segments. For each segment an offset value, $x_n$, is stored in a look-up table. The offset value, $x_n$, is equal to a digital representation of a signal value which compensates for the difference between the desired frequency and the frequency at the start of the segment. When a compensating signal value is required, the compensating signal value calculator retrieves from the look-up table the $x_n$ values corresponding to segments $k-1$, $k$ and $k+1$, where segment k is the segment containing the ambient temperature.

The retrieved values, labeled $x_{k-1}$, $x_k$, and $x_{k+1}$, respectively, are then used to compute the coefficients in the second-order Taylor Series equations of the form:

$$x(T_n) = x_n + (x'_n)(\text{delta } T) + \left(\frac{x''_n}{2}\right)(\text{delta } T)^2 \quad (1)$$

where $x(T_n)$ is the compensating signal value, $x'_n$ and $x''_n/2$ are linear and second-order coefficients, T is the ambient temperature, and delta T is the difference between the ambient temperature and the temperature at start of the $k^{th}$ segment.

Letting $x_k$ correspond to delta T equal zero, $x_{k-1}$ correspond to delta $T_{k-1} = -1$ and $x_{k+1}$ correspond to delta $T_{k+1} = 1$ results in three equations:

$$x_n + (x'_n)(-1) + \left(\frac{x''_n}{2}\right)(-1)^2 = x_{k-1}$$

$$x_n + (x'_n)(0) + \left(\frac{x''_n}{2}\right)(0)^2 = x_k$$

$$x_n + (x'_n)(+1) + \left(\frac{x''_n}{2}\right)(+1)^2 = x_{k+1}$$

The calculator solves these equations simultaneously for the linear and second-order coefficients corresponding to the $k^{th}$ segment:

$$x'_n = \left(\frac{x_{k+1} - x_{k-1}}{2}\right)$$

$$x''_n = x_{k+1} - 2x_k + x_{k-1}$$

Equation 1 becomes:

$$x(T) = x_k + \left(\frac{x_{k+1} - x_{k-1}}{2}\right)(\text{delta } T) + \quad (2)$$

$$\left(\frac{x_{k+1} - 2x_k + x_{k-1}}{2}\right)(\text{delta } T)^2$$

The calculator then substitutes the actual delta T value into the equation characterizing the $k^{th}$ segment and calculates the compensating signal value, $x(T)$.

The frequency of the oscillator output signal also changes as the crystal ages. The frequency change is unrelated to temperature and thus the entire transfer curve is moved up or down. To compensate for this shift an aging offset value, $x_A$, equal to the change in signal value required to offset the frequency shift is included in the Taylor Series function. Equation 2 then becomes:

$$x(T) = x_k + \left(\frac{x_{k+1} - x_{k-1}}{2}\right)(\text{delta } T) + \quad (3)$$

-continued $$\left(\frac{x_{k+1} - 2x_k + x_{k-1}}{2}\right)(\text{delta } T)^2 + x_A$$

The aging offset value, $x_A$, is stored in the look-up table along with the temperature-related offset values.

BRIEF DESCRIPTION OF THE DRAWINGS

The above and further advantages of the invention may be better understood by referring to the following description in conjunction with the accompanying drawings, in which.

DETAILED DESCRIPTION

Figure 1:
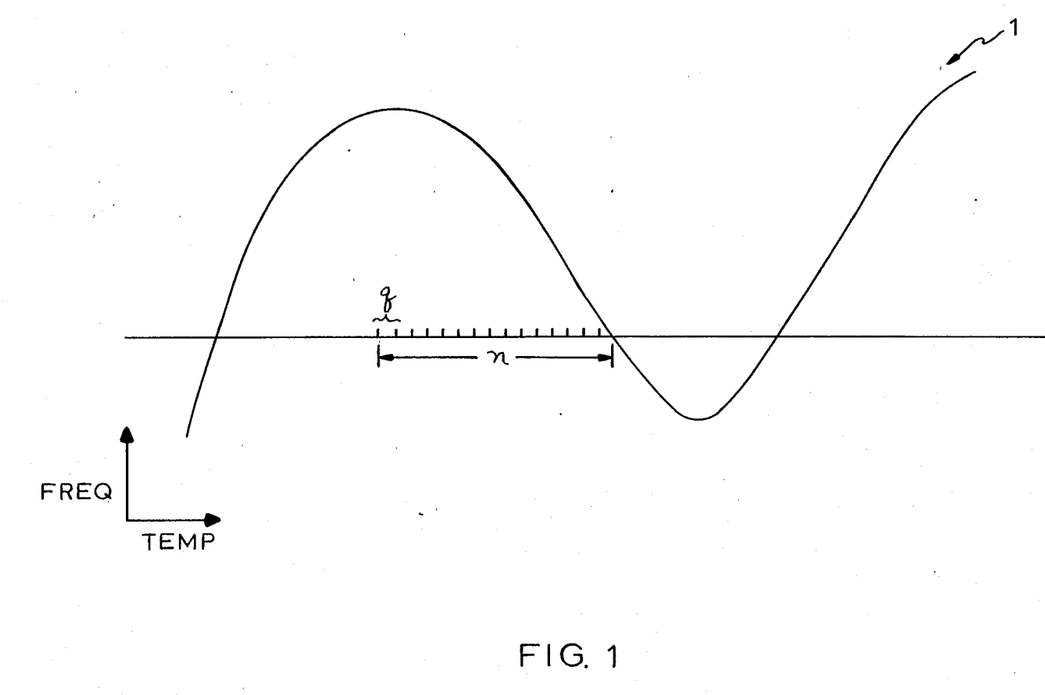
FIG. 1 illustrates a temperature-frequency transfer curve for a voltage-controlled oscillator.

The frequency of the output signal of a crystal oscillator varies with changes in ambient temperature. FIG. 1 is an illustration of a temperature-frequency transfer curve, depicting the frequency of the oscillator output signal as a function of ambient temperature. In order to compensate for the frequency variations attributable to temperature, compensating signals offsetting the frequency changes are used to control the oscillator output signal. The value of the compensating signal corresponding to a particular ambient temperature may be determined by comparing the point of the transfer curve corresponding to the ambient temperature with the desired output signal frequency. The compensation signal value is the inverse, that is, the negative, of this frequency difference.

The purpose of the circuitry is to calculate the compensating signal value which will precisely compensate the oscillator output signal by characterizing the portion of transfer curve surrounding the ambient temperature. Rather than storing a value for every temperature, we partition the transfer curve corresponding to the operative temperature range into segments and store only one value for each segment. The stored value is the compensating value corresponding to a temperature within each segment. In the preferred embodiment the stored values correspond to the temperature at the start of each segment.

When a compensating value is required for a given ambient temperature located in segment k of the transfer curve, a function representing the parabolic curve that includes the stored values for the $k-1$, k and $k+1$ transfer curve segments is formulated. The compensating signal value is equal to the value of the function at the ambient temperature.

In order to calculate the appropriate function coefficients, the transfer curve is partitioned into "n" segments, with n equaling 64 in the preferred embodiment. The segments need not be of equal size, and, in fact, in the preferred embodiment the segments corresponding to steeper portions of the curve are smaller than the segments corresponding to portions of the curve that are not so steep.

The segments are partitioned into "q" sub-segments, with q equaling 16 in the preferred embodiment. The ambient temperature is characterized by the transfer curve segment and sub-segment associated with it. As described in more detail with reference to FIG. 2 below, the sub-segment values are used to measure the difference between the ambient temperature and the temperature at the start of a segment in which the ambient temperature falls. This difference, labeled "delta T", is substituted into the appropriate Taylor Series function to calculate the compensating signal value.

For each segment an offset value, $x_n$, is determined. The offset value is equal to the signal value which compensates for the difference between the desired frequency and the frequency at the segment starting point on the transfer curve 1. The offset values are then stored in a look-up table.

When a compensating signal value is required for an ambient temperature, $T_A$, located in segment k, the offset values $x_{k-1}$, $x_k$ and $x_{k+1}$ associated with segments k−1, k and k+1, respectively, are retrieved from the look-up table. Using these values the calculator circuitry computes the parabola that passes through the points that the values represent.

Specifically, these values are substituted into three Taylor Series functions. Letting delta T for the $k^{th}$ segment equal zero, and substituting values equal to the distance of the segment starting points away from the $k^{th}$ segment starting point for delta $T_{k-1}$ and delta $T_{k+1}$ results in three equations in three unknowns. For example, if $x_{k-1}$ corresponds to delta $T_{k-1} = -1$, and $x_{k+1}$ corresponds to delta T = +1 the equations become:

$$x_n + (x'_n)(-1) + \left(\frac{x''_n}{2}\right)(-1)^2 = x_{k-1}$$

$$x_n + (x'_n)(0) + \left(\frac{x''_n}{2}\right)(0)^2 = x_k$$

$$x_n + (x'_n)(+1) + \left(\frac{x''_n}{2}\right)(+1)^2 = x_{k+1}$$

Solving the equations simultaneously for the coefficients:

$$x'_n = \left(\frac{x_{k+1} - x_{k-1}}{2}\right)$$

$$x''_n = x_{k+1} - 2x_k + x_{k-1}$$

Substituting these coefficients into a second order Taylor Series function corresponding to the $k^{th}$ segment results in the equation:

$$x(T_k) = x_k + \left(\frac{x_{k+1} - x_{k-1}}{2}\right)(\text{delta } T) + \left(\frac{x_{k+1} - 2x_k + x_{k-1}}{2}\right)(\text{delta } T)^2 \quad (2)$$

The compensating signal value is calculated by substituting the actual value of delta T into equation 2. The oscillator output signal is then compensated by applying to the oscillator as the control voltage a compensating signal corresponding to the calculated value.

As the oscillator crystal ages, the frequency of its output signal shifts up or down. This frequency shift is unrelated to the ambient temperature. Thus the frequency shift, in effect, moves the entire temperature-frequency transfer curve up or down by some amount. The compensating signal calculator is recalibrated every so often to determine the amount of the shift and the voltage required to offset it, that is, the aging offset value. This aging offset value is then included in the Taylor Series function and equation 2 becomes:

$$x(T_k) = x_k + \left(\frac{x_{k+1} - x_{k-1}}{2}\right)(\text{delta } T) + \left(\frac{x_{k+1} - 2x_k + x_{k-1}}{2}\right)(\text{delta } T)^2 + x_A \quad (3)$$

where $x_A$ is the aging offset value.

Figure 2:
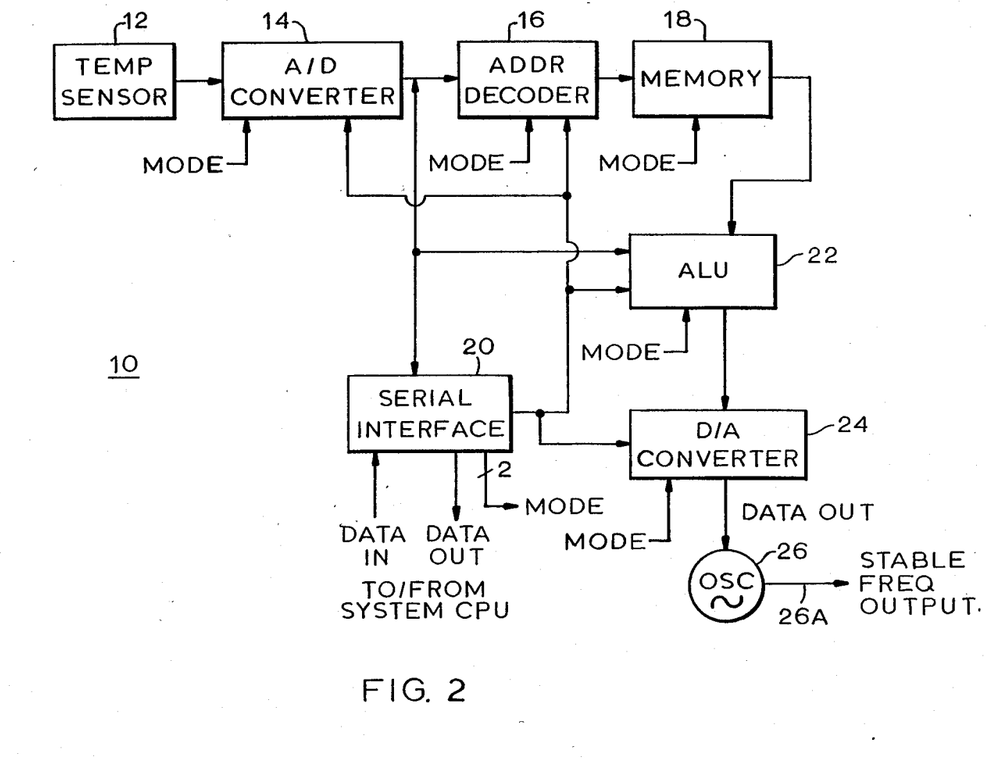
FIG. 2 is a block diagram of a voltage-controlled oscillator employing the invention.

FIG. 2 depicts a compensating signal value calculator circuit 10. A temperature sensor 12 produces a voltage related to the ambient temperature and provides it to an analog-to-digital ("A/D") converter 14. The A/D converter 14 converts the voltage to a 10-bit digital symbol, or temperature word.

The six most significant bits of the temperature word designate the transfer curve segment corresponding to the ambient temperature. The four least significant bits of the temperature word designate the sub-segment containing the temperature. Thus the six most significant bits of the temperature word designate segment k and the four least significant bits designate delta T.

The A/D converter 14 applies the 10-bit temperature word to both an address decoder 16 and an arithmetic logic unit ("ALU") 22. Using the six most significant bits, the address decoder 16 formulates addresses for accessing locations associated with the ambient temperature in a memory 18. The memory 18 contains the offset value look-up table. The addresses supplied by the address decoder 16 access the locations containing the offset values for the k, k−1 and k+1 transfer curve segments.

The offset values for the three segments $x_{k-1}$, $x_k$, and $x_{k+1}$ are retrieved from the look-up table and applied to the ALU 22. The ALU 22 then calculates the coefficients for the Taylor Series function representing the $k^{th}$ segment of the transfer curve in the manner described with reference to FIG. 1 above. The ALU 22 next calculates the compensation signal value by substituting into the Taylor Series function the delta T value received from the A/D converter 14, that is, the four least significant bits of the temperature word. A digital-to-analog ("D/A") converter 24 then converts the compensation signal value, which is a 10-bit digital symbol, to an analog signal. The analog signal is the control voltage applied to voltage-controlled oscillator 26 producing a stable frequency output signal on line 26A.

Circuit control signals and clock information from an external source, for example, a system CPU (not shown), are supplied to the circuit through a serial interface 20. The system CPU dictates in which of four modes, namely, calibrate, program, normal, or test, the circuit operates. The serial interface 20 communicates the operating mode to the remaining circuit elements using two MODE lines. The operation of the circuit 10 in each of the four modes will be described in more detail with reference to FIG. 3 below.

The compensating signal value calculator circuit 10, exclusive of the memory 18, is designed for fabrication on a single integrated circuit chip. The serial interface 20 allows external circuitry access to the circuit through clock and data lines. When the circuit is operating in the normal mode, that is, calculating compensation signal values based on ambient temperature readings, it is internally controlled based on system clock information provided by the CPU.

Figure 3:
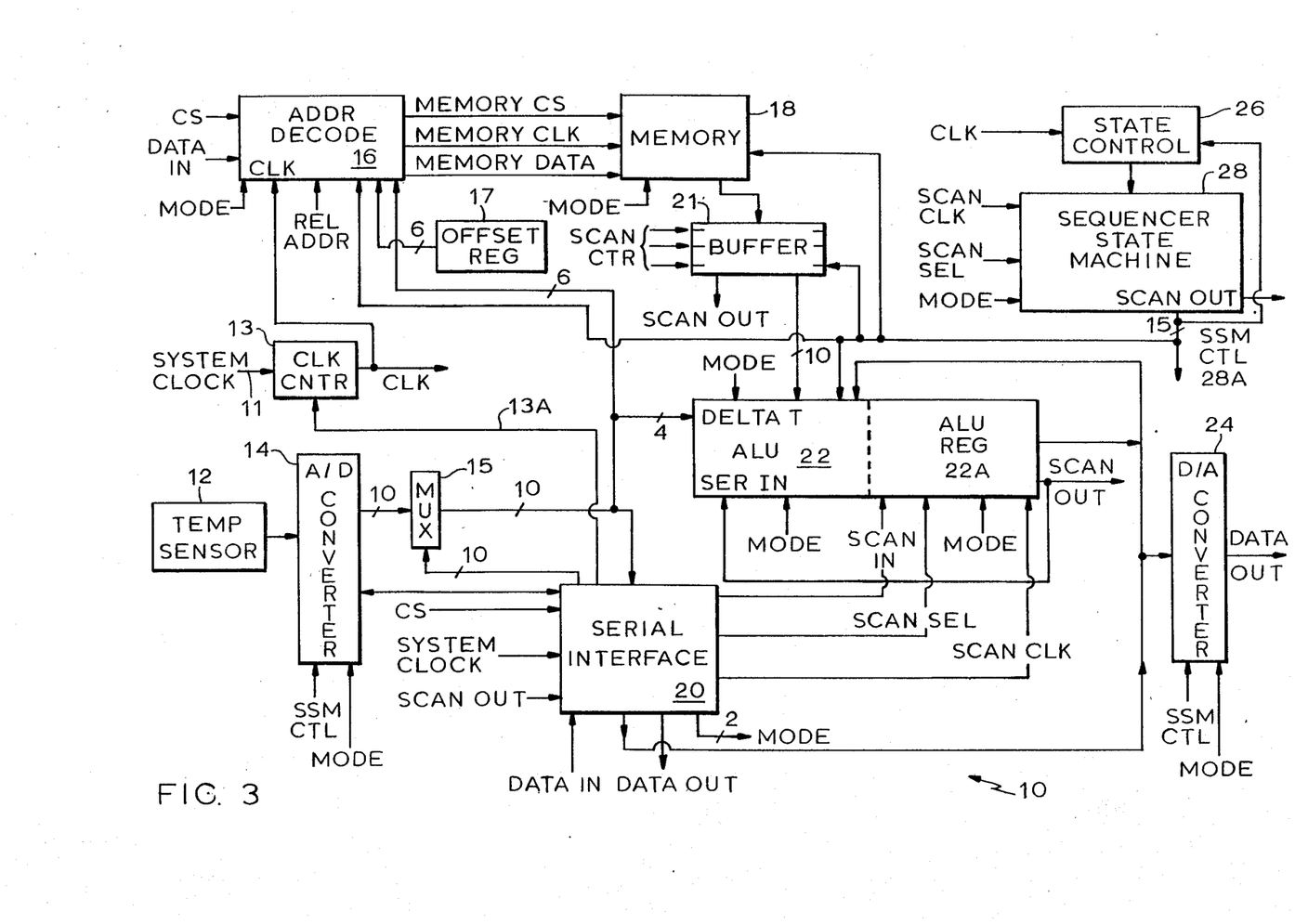
FIG. 3 is a more detailed block diagram of a compensating signal value calculator shown in FIG. 2.

With reference to FIG. 3, a state controller 26 and a sequencer state machine 28 control the operation of the circuit when it is operating in the normal mode. In the preferred embodiment the state controller 26 is an 8-bit counter and the sequencer state machine 28 is a read only memory ("ROM"). The counter, clocked by the system clock, counts the states through which the sequencer state machine SSM 28 steps, addressing the ROM with each count The ROM 28, in response to the changing count, applies various control signals to the remainder of the circuit 10 over SSM control lines 28A.

When the circuit 10 is calculating a compensating signal value it is operating in the normal mode. Thus the serial interface 20 sets the MODE lines to the appropriate value, and forwards from the CPU a chip select, CS, signal which enables the address decoder 16. The calculator circuit 10 is clocked by the system clock signal which is supplied by the system CPU on line 11. The serial interface 20 may be used to slow the operation of the circuit 10, for example, during periods of relatively infrequent changes in ambient temperature, by asserting a slow clock signal on line 13A. The slow clock signal enables a clock controller 13 which, in effect, divides the master clock signal by some predetermined value. By slowing the clock, the circuit 10 requires less power to perform the calculation, and it is thus well suited to battery-powered operation.

The A/D converter 14, which is enabled and strobed by the sequencer state machine 28, converts the temperature reading of the temperature sensor 12 to a corresponding 10-bit temperature word. The temperature word is applied to a multiplexer 15 which normally forwards the six most significant bits to the address decoder 16 and the four least significant bits to the ALU 22.

Using the six most significant bits of the temperature word, the address decoder 16 formulates the memory address corresponding to the $k^{th}$ segment of the transfer curve. The sequencer state machine 28 next sends control signals to the address decoder 16 over a REL ADDR line, one of the SSM control lines 28A, instructing the address decoder 16 to formulate the addresses corresponding to the $k+1$ and $k-1$ transfer curve segments.

The address decoder 16 then sends the addresses to the memory 18 over a MEMORY DATA line. It also sends chip select and memory read instructions, and clock information over a MEMORY CS line and a MEMORY CLK line, respectively. In response the memory 18 retrieves the stored offset values, $x_k$, $x_{k+1}$ and $x_{k-1}$, and sends them to a buffer 21.

In the preferred embodiment the buffer 21 includes four 10-bit registers, three for storing the retrieved transfer curve offset values and a fourth for storing the aging offset value, $x_A$, as discussed above with reference to FIG. 1. The aging offset value, $x_A$, is stored in the memory 18 at a location corresponding to an address contained in an offset register 17. Thus the address decoder 16 retrieves from the offset register 17 the aging offset value address and applies it to the memory 18. The memory 18 accesses the location and supplies the contents of it, the aging offset value, $x_A$, to the buffer 21.

Under the control of the sequence state machine 28, the ALU 22 acquires the contents of the buffer 21 and calculates the Taylor Series coefficients for the $k^{th}$ segment of the transfer curve. Using this function and the delta T value received from the A/D converter 14, the ALU 22 calculates the compensating signal value.

If the transfer curve segments are assumed to be equal in size, the compensating signal value calculation can be performed in one step using equation 2. Thus the offset values in buffer 21 are combined with the delta T value in accordance with equation 3 and the compensating signal value is calculated without explicitly determining the Taylor Series coefficients.

The resulting compensating signal value, which is a 10-bit digital symbol, is stored in ALU register 22A. The ALU register 22A then transmits the symbol, in parallel, to the D/A converter 24. The D/A converter 24 converts the signal value from digital to analog and applies it to the oscillator 26 (FIG. 2).

Before the circuit 10 can calculate compensating signal values, it must be calibrated and programmed. Calibration involves operating the circuit 10 at various temperatures and plotting the temperature-frequency transfer curve. Programming involves writing offset values to the memory 18 locations corresponding to known temperatures. Accordingly, the circuit 10 operates first in the calibrate mode and then in the program mode before it ever operates in normal mode.

Typically, the circuit 10 is calibrated and programmed at the factory under the control of a calibrating-programming CPU. The external CPU communicates with the circuit components through the serial interface 20 over DATA IN and DATA OUT lines. The CPU (not shown) instructs the serial interface 20 to operate the circuit 10 in calibrate mode, and the serial interface 20 communicates the appropriate mode information to the circuit components over the MODE lines.

The circuit 10 operating in calibrate mode is placed in an oven and the ambient temperature is increased. At a predetermined temperature the CPU, through the serial interface 20, applies successive signal values to the D/A converter 24 until a value is found which precisely compensates the oscillator output signal. The CPU then stores this value and the corresponding temperature word produced by the A/D converter 14 in response to the corresponding temperature signal from temperature sensor 12. This procedure is repeated for various temperatures until the temperature-frequency characteristics of the oscillator are determined. The CPU then plots the temperature-frequency transfer curve.

Once the transfer curve is known, the CPU partitions the curve into n segments and determines the offset value, $x_n$, corresponding to the start of each segment. The circuit 10 is then operated in program mode to write the offset values to the memory 18.

In program mode the CPU, through serial interface 20, loads the memory 18. The serial interface 20 behaves as a transparent interface between the CPU and the address decoder 16. Thus the CPU supplies to the address decoder 16, over the DATA IN line, the temperature word and the associated offset values, $x_n$, corresponding to the starting point of each of the n transfer curve segments. Using the six most significant bits of a temperature word, the address decoder 16 addresses a location in the memory 18 and writes to it the associated offset value, $x_n$.

The memory location assigned to the aging offset value is written with an offset value, $x_A$, signifying the lack of aging effects. Thus, for example, the location may have an all ZERO symbol written in. Thereafter, the calibrated aging offset values written to the location will contain a sign-bit to indicate positive or negative offset. In the preferred embodiment the location is first written with the symbol 0111111111, which is the midpoint of all possible offset values. Therafter, the calibrated aging offset values written to the location will be either (numerically) higher or lower to indicate positive or negative offset.

After the circuit has been operating for some time it is re-calibrated at a known temperature, for example, room temperature, to determine if the output signal frequency has shifted due to the aging of the crystal. If there is such a frequency shift, successive compensating signal values are applied to the D/A converter 24 until the oscillator output signal is precisely compensated. The compensating signal value attributable to aging, that is, the difference between the calculated offset value and the calibrated offset value, is then written to the memory location reserved for the aging offset value, $x_A$. Thereafter, the circuit is re-calibrated at room temperature as often as necessary. The need for re-calibration is determined by the particular aging characteristic of the crystal and, also, by the frequency-precision requirements of the system in which the oscillator is operating.

In the preferred embodiment re-calibration is performed by comparing the frequency of the output signal with a known, highly precise clock signal. The CPU performs the comparison, integrates and averages the signal difference over time, and combines the results with the stored $x_A$ value to calculate a new $x_A$ value. This new $x_A$ value is then stored in the memory 18. Re-calibration is thus performed using integrated circuit components and the system CPU. Accordingly, re-calibration can be performed automatically and relatively frequently, for example, each time the circuitry is powered-up.

The calculator circuit 10 is configured for easy testing. Several components have "scan" architecture enabling them to operate their internal registers as shift registers, serially shifting out the register contents. When the serial interface 20 receives from the system CPU an instruction to perform testing, it asserts a testing mode signal over the MODE lines. Operating in testing mode, various scan architecture components are tested by scanning, and various other components are tested by checking the results of predetermined operations, for example, analog-to-digital conversion of a known value. The serial interface 20 controls the testing of the scan-type components using scan control lines, namely SCAN IN, SCAN SEL, and SCAN CLK.

The system CPU sends testing instructions to the serial interface 20 over a DATA IN line. The serial interface 20 then selects the components for testing, by asserting the appropriate chip select lines, and provides data and clock information to them, as necessary, over the SCAN control lines. The components send test information back to the serial interface 20 over a SCAN OUT line, and the serial interface 20 transmits this information to the system CPU over the DATA OUT line.

The CPU then analyzes the data to determine if the components are correctly operating.

The circuit 10 may also be fully digitally tested by by-passing the A/D converter 14 and the D/A converter 28. The serial interface 20 transmits a digital symbol directly to the multiplexer 15 and operates the decoder 16 and the ALU 22 to complete the compensating signal calculation. The serial interface 20 then retrieves the resulting compensating signal value from the ALU register 22A before the D/A converter 28 converts it to an analog signal.

Figure 4:
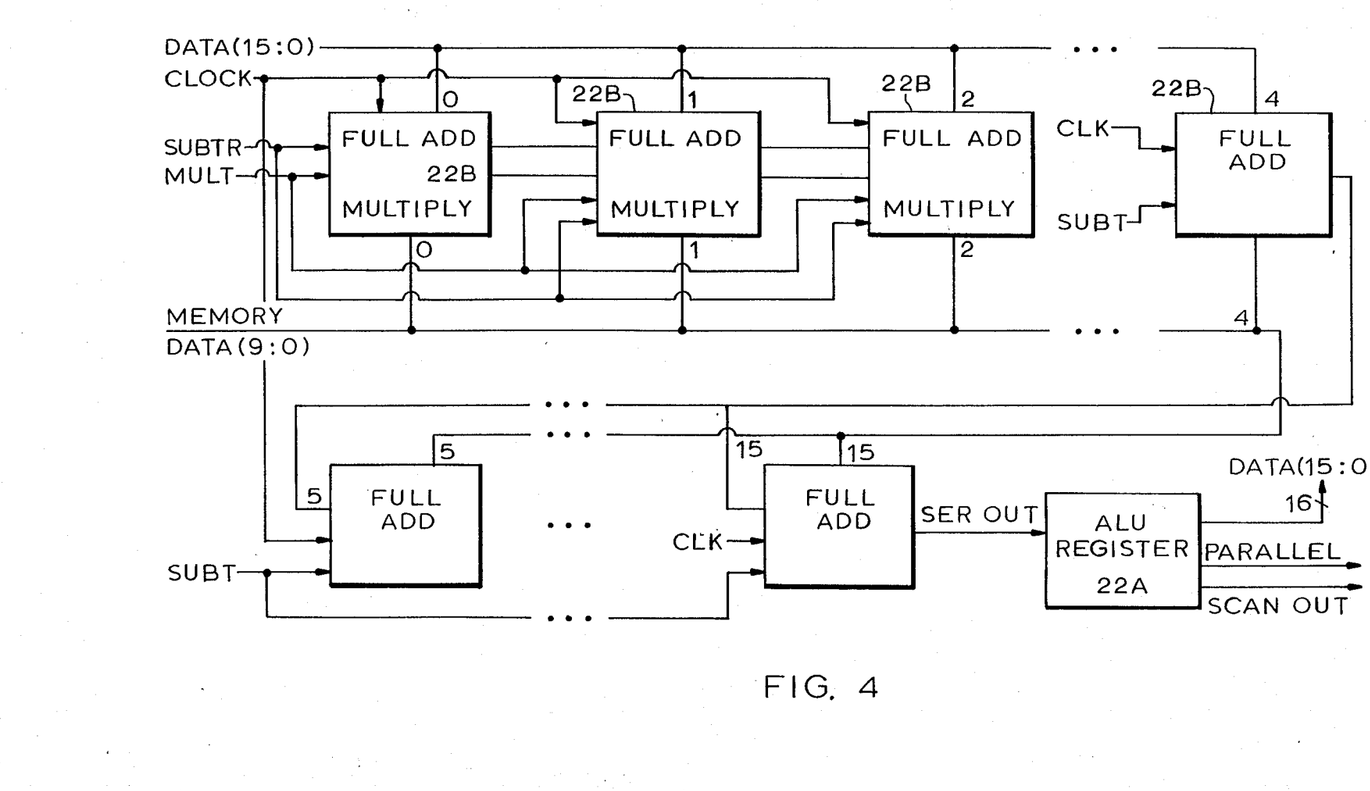
FIG. 4 is a block diagram of an arithmetic logic unit shown in FIG. 2.

FIG. 4 depicts the ALU 22 in block diagram form. It is hardware efficient, containing a minimal number of gates. The ALU 22 includes sixteen full adders 22B connected such that each adder 22B corresponds to one of sixteen data bits. Each adder 22B also includes a 2:1 multiplexer for multiplexing the data bit to the adder 22B in a true or inverted form, allowing the adder 22B to perform addition or subtraction, respectively.

The ALU 22 retrieves the four offset values stored in buffer 21 (FIG. 3) and manipulates them in the manner described above with reference to FIG. 1, producing the offset, linear and second-order coefficients of a second-order Taylor Series function. The coefficients are stored in ALU register 22A.

The four adders 22B corresponding to bits 0-3 also function is full multipliers with a summing capability implementing a bit serial architecture. The adder-multipliers 22B multiply the contents of ALU register 22A by the four-bit delta T value, that is, the four least significant bits of the 10-bit temperature word received from A/D converter 14, by serially shifting in the coefficients stored in the 16-bit ALU register 22A. The products are summed and shifted to achieve the proper placement of the binary digits in the ALU register 22A, forming a 10-bit compensating signal value.

As discussed above with reference to FIG. 3, the ALU 22 may be configured to calculate the compensating signal value using equation 3. Thus the temperature and aging offset values are retrieved from the buffer 21 (FIG. 3) and they are combined with the delta T value received from the A/D converter 14 (FIG. 3) to calculate the various terms of equation 3, without explicitly calculating the linear and second order coefficients. The terms are then summed and shifted, as set forth above, to achieve the proper placement of the binary digits in the ALU register 22A.

The compensating signal value calculator generates a compensating signal which accurately compensates for frequency variations in the output signal of a voltage-controlled oscillator. The circuit generates the compensating signal by calculating coefficients for a second-order Taylor Series function describing the portion of the oscillator temperature-frequency transfer curve corresponding to the ambient temperature. Using this function and the ambient temperature, the circuit then calculates the compensating signal value required to maintain the output signal precisely at the desired frequency.

The circuit not only compensates the output signal for frequency variations due to changes in ambient temperature, it also compensates for variations due to the aging of the oscillator crystal. An aging offset value is included in the second-order Taylor Series to offset the inevitable shift, up or down, of the transfer curve due to the aging of the crystal. Thus the circuit precisely compensates the oscillator output signal for both temperature and age.

The compensating signal value calculation circuit is designed for ease of manufacturability and low power consumption. The circuit is configured to fit on a single integrated circuit chip with an external, programmable memory. Due to its low power consumption, the circuit may be used in connection with battery-powered circuitry, for example, as part of a cellular telephone.

The foregoing description has been limited to a specific embodiment of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed is:

1. A voltage-controlled crystal oscillator, said oscillator including:
    A. an oscillator crystal having an output signal whose frequency varies with temperature;
    B. a temperature sensor for sensing ambient temperature and producing a signal related to the temperature;
    C. a memory for storing for each of a predetermined number of ambient temperatures a temperature offset value equal to the difference between the oscillator frequency at the ambient temperature and the oscillator frequency at a known different temperature, said temperature offset values being stored at memory locations associated with the ambient temperatures;
    D. an address decoder connected between said temperature sensor and said memory, said address decoder receiving the output of said temperature sensor and addressing locations in said memory associated with the ambient temperature;
    E. a function calculator connected to receive the contents of the memory locations addressed by said address decoder and the output of said temperature sensor for calculating a compensating signal value depending on the retrieved temperature offset values and directly related to the ambient temperature; and
    F. a converter connected to receive the calculated compensating signal value for converting the signal value to a compensating signal and applying the signal to the controlling input of the crystal oscillator.

2. The oscillator of claim 1, wherein said memory further includes a location for storing an aging offset value, said memory supplying said aging offset value to said function calculator when a compensating signal value is being calculated.

3. The oscillator of claim 2, wherein said oscillator further includes means for calculating an aging offset value to compensate the output signal for shifts in frequency due to the aging of the crystal.

4. The oscillator of claim 1, wherein said address decoder addresses a predetermined number of memory locations associated with the ambient temperature, said predetermined number being greater than or equal to three.

5. The oscillator of claim 4 wherein said temperature offset values stored in said memory correspond to ambient temperatures associated with various segments of a temperature-frequency transfer curve, said curve representing output signal frequency as a function of temperature.

6. The oscillator of claim 5 wherein said function calculator calculates linear, and second-order coefficients of a second order Taylor Series function describing the transfer curve segment corresponding to the ambient temperature.

7. The oscillator of claim 6 wherein said function calculator calculates the coefficients using the temperature offset value stored in said memory corresponding to the segment of the temperature-frequency transfer curve associated with the ambient temperature, $x_k$, and the temperature offset values corresponding to the curve segments immediately preceding and succeeding said segment, $x_{k-1}$ and $x_{k-1}$.

8. The oscillator of claim 7 wherein said function calculator calculates the linear, and second-order coefficients $x'_n$, and $x''_n$, using the formulas:

$$x'_n = \left( \frac{x_{k+1} - x_{k-1}}{2} \right)$$

$$x''_n = x_{k+1} - 2x_k + x_{k-1}.$$

9. A method of compensating a voltage-controlled crystal oscillator for output signal frequency variations including the steps of:
    A. sensing ambient temperature and producing a signal related to the ambient temperature;
    B. retrieving from a look-up table temperature offset values associated with the ambient temperature, said offset values representing compensating signal values corresponding to predetermined temperatures associated with the ambient temperature;
    C. using the retrieved temperature offset values, calculating coefficients of a function describing for the crystal a temperature-frequency relationship over a predetermined temperature range, said range including the ambient temperature;
    D. calculating a compensating signal value corresponding to the ambient temperature using the function;
    E. converting the calculated compensating signal value to an analog compensating signal; and
    F. applying the compensating signal to the crystal oscillator as the voltage-control signal.

10. The compensating method of claim 9, wherein said retrieving step includes retrieving temperature offset values corresponding to segments of the crystal temperature-frequency curve, said segments for which offset values are retrieved are:
    i. the $k^{th}$ segment corresponding to the ambient temperature;
    ii. the $(k-1)^{st}$ segment, preceding the segment corresponding to the ambient temperature; and
    iii. the $(k+1)^{st}$ segment, succeeding the segment corresponding to the ambient temperature.

11. The compensating method of claim 9, wherein said calculating step includes calculating linear, and second-order coefficients for a Taylor Series function of the form:

$$x(T_k) = x_k + \left( \frac{x_{k+1} - x_{k-1}}{2} \right)(\text{delta } T) +$$

$$\left(\frac{x_{k+1} - 2x_k + x_{k-1}}{2}\right)(\text{delta } T)^2$$

where $x_n$, $x'_n$ and $x''_n$ are the offset, linear and second-order coefficients, $x(T)$ is the compensating signal value and delta T is the difference between the ambient temperature and the temperature at the start of the kth segment.

12. The compensating method of claim 11, wherein said calculating step further includes calculating the coefficients using the following formulas:

$$x_n = x_k$$

$$x'_n = \left(\frac{x_{k+1} - x_{k-1}}{2}\right)$$

$$x''_n = x_{k+1} - 2x_k + x_{k-1}$$

13. The compensating method of claim 12, wherein said method further includes the steps of:

A. retrieving from the look-up table an offset value $x_A$ associated with output signal frequency shifts due to aging of the crystal; and B. calculating the coefficients of a Taylor Series function of the form:

$$x(T_k) = x_k + \left(\frac{x_{k+1} - x_{k-1}}{2}\right)(\text{delta } T) + \left(\frac{x_{k+1} - 2x_k + x_{k-1}}{2}\right)(\text{delta } T)^2 + x_A.$$

* * * * *